(12) United States Patent
Zhao

(10) Patent No.: US 11,338,361 B2
(45) Date of Patent: May 24, 2022

(54) CASTING SHELL MOLD CHAMBER, FOUNDRY FURNACE AND METHOD FOR CASTING SINGLE CRYSTAL, FINE CRYSTAL AND NON-CRYSTAL

(71) Applicant: Jingchen Zhao, Beijing (CN)

(72) Inventor: Jingchen Zhao, Beijing (CN)

( * ) Notice: Subject to any disclaimer, the term of this patent is extended or adjusted under 35 U.S.C. 154(b) by 12 days.

(21) Appl. No.: 16/843,350

(22) Filed: Apr. 8, 2020

(65) Prior Publication Data

US 2020/0338636 A1    Oct. 29, 2020

(30) Foreign Application Priority Data

Apr. 24, 2019    (CN) .......................... 201910336969.9

(51) Int. Cl.
| | | |
|---|---|---|
| *B22D 27/04* | (2006.01) | |
| *B22D 25/06* | (2006.01) | |
| *B22D 27/02* | (2006.01) | |
| *C30B 11/00* | (2006.01) | |
| *C30B 29/52* | (2006.01) | |
| *C30B 30/04* | (2006.01) | |

(52) U.S. Cl.
CPC ............. *B22D 27/04* (2013.01); *B22D 25/06* (2013.01); *B22D 27/02* (2013.01); *C30B 11/003* (2013.01); *C30B 29/52* (2013.01); *C30B 30/04* (2013.01)

(58) Field of Classification Search
CPC ........ B22D 27/02; B22D 27/04; B22D 25/06; B22D 27/045
See application file for complete search history.

(56) References Cited

FOREIGN PATENT DOCUMENTS

| CN | 108817357 A | 11/2018 |
|---|---|---|
| CN | 109280961 A | 1/2019 |

OTHER PUBLICATIONS

English Language Abstract for CN 108817357 A (2018).
Russian Office Action dated Nov. 6, 2020 with English Translation.
English Abstract for CN 109280961 A (2019).
European Search Report dated Jun. 8, 2020.
English Language Abstract for CN 109280961 A (2019).
European Office Action dated Apr. 13, 2021.

*Primary Examiner* — Kevin P Kerns
*Assistant Examiner* — Steven S Ha
(74) *Attorney, Agent, or Firm* — Caesar Rivise, PC

(57) ABSTRACT

The present disclosure discloses a shell mold chamber, a foundry furnace and a method for casting single crystal, fine crystal and non-crystal, which employ the technique of asynchronous-curving supercooling, and belongs to the technical field of precise casting apparatuses. Such a three-function foundry furnace includes a heating coil winding, a first thermal-shield assembly, a first superconducting coil, a second thermal-shield assembly and a second superconducting coil; and the first superconducting coil is provided at an inside of the first thermal-shield assembly, and the second superconducting coil is provided at an inside of the second thermal-shield assembly; and directions of a magnetic field generated by the first superconducting coil and a magnetic field generated by the second superconducting coil are opposite; and the first superconducting coil and the heating coil winding form a forward-directional static-magnetic-field heating zone, and the second superconducting coil forms a reverse-directional static-magnetic-field zone.

4 Claims, 8 Drawing Sheets

CASTING SHELL MOLD CHAMBER, FOUNDRY FURNACE AND METHOD FOR CASTING SINGLE CRYSTAL, FINE CRYSTAL AND NON-CRYSTAL

CROSS-REFERENCE TO RELATED APPLICATIONS

This application claims priority to Chinese Patent Application No. 201910336969.9, filed Apr. 24, 2019, the contents of which are hereby incorporated by reference in their entireties.

TECHNICAL FIELD

The present disclosure relates to a precise casting apparatus, and particularly relates to a casting-shell mold chamber, a foundry furnace and a method for casting single crystal, fine crystal and non-crystal, which employ the technique of asynchronous curving of space-time supercooling.

BACKGROUND ART

In the prior art, the functions of all foundry furnaces are single, and they cannot have at the same time the three functions of casting single crystal, casting fine crystal and casting non-crystal.

Specifically, single-crystal furnaces are merely used to produce single-crystal castings. The grain structure of single-crystal castings does not have grain boundary, and the entire casting is one grain. The conventional industrial single-crystal furnaces grow the single crystal in the mode of dendritic crystals, and once the dendritic crystal falls, the residue of the fallen dendritic crystal deteriorates the growth condition of the single crystal, and affects the growth of the single crystal. Even if the dendritic crystal does not fall, the dendritic-crystal-type single crystal is far poorer than planar-solidification-type single crystal, which has not yet be used for industrial production. That is because the dendritic-crystal-type single crystal has dendritic-crystal component segregation, solidification microporosity and low-angle grain boundary easily appear between the dendritic crystals, and so on.

Fine-crystal furnaces are used to produce fine-crystal castings. The grain structure of fine-crystal castings should contain as many grains as possible, and the grain size should be as small as possible. The conventional fine-crystal furnaces cannot form fine isometric crystals having a good uniformity, a good isotropy and a good stability, and, because they cannot form a deep-supercooled pure liquid for filling a mold cavity and stably solidifying, their molding-cavity filling capacity and refining degree of grain are poor.

As for non-crystal metals, they have the characteristics of a high strength, a high elasticity, a high magnetic permeability, a good abrasive resistance, a good corrosion resistance and a good isotropy. Currently, the production of non-crystal metal products does not involve foundry furnaces. The conventional methods for producing non-crystal metals mainly include vapor deposition, chemical deposition, ion-implantation electrodeposition, single-roller method and double-roller method, and there have not been foundry furnaces for producing non-crystal metals. However, all of the non-crystal metals that are obtained by the above methods are thin bands of thicknesses below 1 mm. If they are required to be manufactured into blocks, the thin bands must be superimposed, and obviously, the property of such blocks is anisotropic. Moreover, in the conventional dual-function foundry furnaces for single crystal and fine crystal, the coil is required to simultaneously be heated and generate a static magnetic field, which results in that it cannot generate an intense magnetic field, and the supercooling degree of the metal or alloy liquid is insufficient.

SUMMARY OF THE DISCLOSURE

In view of the above-described analysis, the present disclosure aims at providing a casting-shell mold chamber, a foundry furnace and a method for casting single crystal, fine crystal or non-crystal, which employ the technique of asynchronous curving of space-time supercooling, which solves the problems in the prior art that foundry furnaces cannot have at the same time the three functions of casting single crystal, casting fine crystal and casting non-crystal, that non-crystal states still cannot obtain products in conventional sense of casting, that single crystal cannot reach the level of planar solidification of non-dendritic crystal in industry, and that fine-crystal casting cannot satisfy the requirement by a certain products on the compactness due to its high solidification speed.

An object of the present disclosure is realized mainly by the following technical solution:

In an aspect, the present disclosure discloses a casting-shell mold chamber, wherein the casting-shell mold chamber includes a heating coil winding, a first thermal-shield assembly, a first superconducting coil, a second thermal-shield assembly and a second superconducting coil; and the first thermal-shield assembly is provided at an outside of the heating coil winding, the first superconducting coil is provided at an inside of the first thermal-shield assembly, and the second superconducting coil is provided at an inside of the second thermal-shield assembly; the second thermal-shield assembly is provided under the first thermal-shield assembly, and directions of a magnetic field generated by the first superconducting coil and a magnetic field generated by the second superconducting coil are opposite; and the first superconducting coil and the heating coil winding form a forward-directional static-magnetic-field heating zone, and the second superconducting coil forms a reverse-directional static-magnetic-field zone.

Optionally, the first thermal-shield assembly includes first thermal-shields that are located at two sides of the first superconducting coil and first thermal-shield cover plates that are located at a top and a bottom of the first superconducting coil, and the first thermal shields and the first thermal-shield cover plates form a space for containing the first superconducting coil; and the second thermal-shield assembly includes second thermal-shields that are located at two sides of the second superconducting coil and second thermal-shield cover plates that are located at a top and a bottom of the second superconducting coil, the second thermal-shields and the second thermal-shield cover plates form a space for containing the second superconducting coil, a heating coil is provided at an inside of the first superconducting coil, and an overcooling-treatment crucible is provided at an inside of the heating coil winding.

Optionally, a carbon-fiber thermal-insulation-layer cover plate and a magnetism-receptor thermal-insulation shield are provided respectively over and under the first thermal-shield assembly; and the carbon-fiber thermal-insulation-layer cover plate and the magnetism-receptor thermal-insulation shield are provided respectively at a top and a bottom of a pressurizing furnace chamber.

Optionally, a graphite loading plate is provided between the first thermal-shield assembly and the second thermal-shield assembly, and the graphite loading plate is provided under the magnetism-receptor thermal-insulation shield; and the first thermal-shield assembly is sleeved by a housing, and the housing is configured to surround the heating coil winding, the thermal-insulation layer, a first cooling pipeline and the first thermal-shield assembly and form a closed space.

In another aspect, the present disclosure further discloses a foundry furnace, wherein the foundry furnace includes a pressurizing furnace chamber, a vacuum furnace chamber, a lifting-vertical-column combined crystallizer, a casting-shell mold, a casting-shell mold lifting tray and the above-described casting-shell mold chamber; the casting-shell mold is provided on the casting-shell mold lifting tray, and the casting-shell mold lifting tray is provided on the lifting-vertical-column combined crystallizer; and the heating coil winding, the first thermal-shield assembly and the first superconducting coil are located within the pressurizing furnace chamber; and the second thermal-shield assembly and the second superconducting coil are located within the vacuum furnace chamber.

Optionally, the foundry furnace further includes a melting crucible and the casting-shell mold chamber, and the casting-shell mold chamber includes a supporting cylinder, an overcooling-treatment crucible and a thermocouple temperature-measuring-rod combined plunger bar; and the supporting cylinder is configured to support the overcooling-treatment crucible, and the thermocouple temperature-measuring-rod combined plunger bar before steel liquid enters the overcooling-treatment crucible has a function of isolating the pressurizing furnace chamber and the vacuum furnace chamber, and after the steel liquid enters the overcooling-treatment crucible has a function of measuring a temperature and plugging a supercooled-metal-or-alloy-liquid bottom nozzle.

Optionally, the foundry furnace further includes a thermal-insulation pad, and the thermal-insulation pad is provided between the casting-shell mold and the casting-shell mold lifting tray.

In another aspect, the present disclosure further discloses a method for casting single crystal or directional solidification, and the method uses the above-described foundry furnace, wherein the method for casting single crystal or directional solidification includes the following steps:

Step 1: starting up the first thermal-shield assembly, the first cooling pipeline and the second thermal-shield assembly, vacuumizing the pressurizing furnace chamber and the vacuum furnace chamber into a vacuum state, and maintaining a certain vacuum degree; and then melting a mother-alloy raw material in the melting crucible;

Step 2: starting up the first superconducting coil, the heating coil winding and the second superconducting coil, to form an intense-static-magnetic-field environment within the casting-shell mold for single-crystal or directional-solidification, the casting-shell mold is within the casting-shell mold chamber, and the casting-shell mold chamber is within the pressurizing furnace chamber, and then teeming the molten mother alloy that has been molten in the melting crucible in Step 1 into the casting-shell mold, to realize deep supercooling in the intense-static-magnetic-field environment; and Step 3: pulling down the casting-shell mold of Step 2 into the vacuum furnace chamber by using the lifting-vertical-column combined crystallizer, during the pulling down process the casting-shell mold passes through from top to bottom the magnetism-receptor thermal-insulation shield and a zero-magnetism plane that is formed by the mutually-reverse-directional static magnetic fields of the second superconducting coil and the first superconducting coil, to cause the metal or alloy liquid within the casting-shell mold to solidify sequentially from bottom to top into a single-crystal or directional-solidification product.

In another aspect, the present disclosure further discloses a method for casting fine crystal or non-crystal, and the method uses the above-described foundry furnace, wherein the method for casting fine crystal or non-crystal includes the following steps:

Step 1: starting up the first thermal-shield assembly, the first cooling pipeline and the second thermal-shield assembly, vacuumizing the pressurizing furnace chamber and the vacuum furnace chamber into a vacuum state, and maintaining a certain vacuum degree; and then melting a mother-alloy raw material in the melting crucible;

Step 2: inflating an inert gas into the pressurizing furnace chamber, and controlling a pressure at a preset pressure value; starting up the first superconducting coil and the heating coil winding, to form an intense-static-magnetic-field environment within the overcooling-treatment crucible which is within the casting-shell mold chamber, and the casting-shell mold chamber is within the pressurizing furnace chamber; and then teeming the mother alloy that has been molten in the melting crucible in Step 1 into the overcooling-treatment crucible within the casting-shell mold chamber; and Step 3: cooling the metal or alloy liquid within the overcooling-treatment crucible to a certain temperature below a melting point of the metal or alloy liquid, and lifting upwardly the thermocouple temperature-measuring-rod combined plunger bar, to teem the metal or alloy liquid into the casting-shell mold; then the metal or alloy liquid within the casting-shell mold solidifies into a fine crystal or a non-crystal.

In yet another aspect, the present disclosure further discloses a method for casting fine crystal or non-crystal, and the method uses the above-described foundry furnace, wherein the method for casting fine crystal or non-crystal includes the following steps:

Step 1: starting up the first thermal-shield assembly, the first cooling pipeline and the second thermal-shield assembly, vacuumizing the pressurizing furnace chamber and the vacuum furnace chamber into a vacuum state, and maintaining a certain vacuum degree; and then melting a mother-alloy raw material in the melting crucible;

Step 2: inflating an inert gas into the pressurizing furnace chamber, and controlling a pressure at a preset pressure value; starting up the first superconducting coil and the heating coil winding, to form an intense-static-magnetic-field environment within the casting-shell mold chamber within the pressurizing furnace chamber; and Step 3: lifting the casting-shell mold into the supercooled casting-shell mold chamber in the pressurizing furnace chamber by using the lifting-vertical-column combined crystallizer, and teeming the molten mother alloy that has been molten in Step 1 into the casting-shell mold within the supercooled casting-shell mold chamber; because the first superconducting coil of Step 2 provides an intense static magnetic field for a long time and stably, during the deep supercooling the metal or alloy liquid completes escaping of bubbles and inclusions, and a compact fine crystal is formed after the first superconducting coil is shut down; or an average translation kinetic energy that the metal or alloy liquid state requires is lost due to heat dissipation, and therefore a non-crystal is formed.

As compared with the prior art, the present disclosure can realize at least one of the following advantageous effects:

(1) As compared with the prior art, the present disclosure employs superimposing an intense-acting-force gravitational field in a weak-acting-force gravitational field, or superimposing a weak-acting-force gravitational field in an intense-acting-force gravitational field, which may be called superimposing a second gravitational field. Because two or more gravitational-field susceptor have different feeling to the two mutually superimposing gravitational fields, the curving degrees of the space-time intervals of the two or more gravitational-field sensors are different, which may be called their asynchronous space-time curving, which results in the physical phenomenon of the difference between the behavior of the two or more gravitational-field sensors and the behavior without superimposing the second gravitational field. Here, the weak-acting-force gravitational field refers to the gravitational field of the universal gravitation, and the intense-acting-force gravitational field refers to the electrostatic electromagnetic field. The relative intensity of the electrostatic electromagnetic field in the four fundamental forces of physics is $10^{-2}$, while that of the universal gravitation is $10^{-40}$, which are very greatly different. If they are superimposed, the behavior of the electrons of the atoms located in it is different from that of not being superimposed, and the degree of change increases along with the increase of the intensity of the electrostatic field. The casting-shell mold chamber provided by the present disclosure uses a superconducting material to manufacture the first superconducting coil and the second superconducting coil. A relatively intense magnetic field is formed within the first superconducting coil, the weaker universal gravitational field and the more intense static magnetic field are mutually superimposed, which can generate asynchronous curving of the above-mentioned space-time intervals. The bond and crystallization metal or alloy liquid cannot form between atoms and atoms of the metal or alloy liquid, whereby the alloy generates a liquid-deep-supercooling capacity which has a high external-interference tolerance, a high spatial-transference stability and a high time-length stability. Therefore, during the process of the heat dissipation of the metal or alloy liquid within the first superconducting coil, it does not solidify even if the temperature decreases to below its normal-state solidification point, and even dissipates heat till the average translation kinetic energy that is required for maintaining the liquid state has been lost, to solidify into the non-crystal state.

(2) The foundry furnace provided by the present disclosure can be used to cast a fine crystal. Under the industrial magnitude level and the industrial roughness level, the foundry furnace makes the metal or alloy liquid, nucleate and crystallize uniformly and explosively with a large amount at various points of the casting-shell mold, to form a super-fine-crystal structure under a thermodynamic driving force of the deep supercooling and being far larger than that of normal-state solidification. The entire casting cross-section is nearly full of uniform and fine isometric-crystal grains, and the fineness degree of the grains can even exceed that of the forging grade, and the grains do not have the texture and the storage energy of forged and rolled structures, and are isotropic and stable fine isometric crystals. Especially, the duration of the deep supercooling of the liquid in the mold cavity is prolonged, whereby the cavity filling capacity reaches the cavity filling capacity of the pure liquid, and, because the pure liquid can maintain for a duration after the cavity filling has completed, that provides the duration required for gas and inclusions and solidification feeding, to enable its compactness to be equal to those of forging and rolling.

(3) The foundry furnace provided by the present disclosure can be used for directional solidification and casting a single crystal. Because of the intense static magnetic field generated by the first superconducting coil, the asynchronous curving of the space-time intervals where the neutral atoms and their electrons are located is obtained, which results in that the metal or alloy liquid has a supercooling melting point below the normal-state melting point, and on the basis of the temperature width of the common temperature gradient, the temperature width from the normal-state melting point to the supercooling melting point is superimposed, which is equivalent to improving the temperature gradient in the casting process of single crystal, which can reach the level of planar solidification, nearly without dendritic crystal. Furthermore, because such supercooling is caused by preventing the electrons of the atoms from forming bonds and crystallizing, and is not supercooling generated by being clean and quite, it has the industrial magnitude level and the industrial roughness tolerance level, so it can be used to draw oriented eutectic authigenic fiber composite products if the intensity of the static magnetic field is sufficient, the service performance of which is far better than that of the conventional single-crystal products. Moreover, the providing of the second thermal-shield assembly reduces the temperature within the second superconducting coil, which can further improve the temperature gradient in the directional solidification and the casting process of single crystal.

(4) The foundry furnace provided by the present disclosure can be used to cast non-crystal products. The non-crystal-metal-or-alloy products that are obtained by solidification by using the technique of asynchronous-curving of space-time supercooling, because of the balanced solidification after all of the average translation kinetic energy of the supercooled liquid is dissipated, compared with the non-crystal-metal-or-alloy products that are manufactured by quenching methods such as single-roller method, double-roller method and so on, which are currently used for industrial production, tend to the thermodynamic equilibrium state to a further extent, and have smaller storage energy. Therefore, the non-crystal-metal-or-alloy products have smaller trend of crystallization reaction in use, which makes its trend of reduced non-crystal performance be smaller.

The other characteristics and advantages of the present disclosure will be described below in the description, and part of the advantages can become apparent from the description, or become apparent in the implementation of the present disclosure. The objects and other advantages of the present disclosure can be implemented and obtained from the contents that are particularly pointed out in the description and the drawings.

BRIEF DESCRIPTION OF DRAWINGS

The drawings are merely for the purpose of illustrating the particular embodiments, and are not considered as limitation to the present disclosure. Throughout the drawings, the same reference signs denote the same elements.

REFERENCE NUMBERS

1—thermocouple temperature measuring display; 2—thermocouple temperature-measuring-rod combined plunger bar; 3—peephole; 4—furnace cover; 5—melting crucible; 6—pressurizing furnace chamber; 7—inert-gas pressurizing device; 8—air evacuation valve; 9—vacuum furnace chamber; 10—casting-shell mold; 11—casting-shell mold lifting tray; 12—second lifting mechanism; 13—lifting-vertical-column combined crystallizer; 14—high-pressure sealing ring; 15—overcooling-treatment device; 16—heat-resistant-steel bellows; 17—vacuum high-pressure sealing ring; 18—first lifting mechanism; 19—hauling electric motor; 20—circulated-forced-cooling-liquid outputting pipeline; 21—circulated-forced-cooling-liquid inputting pipeline; 22—vacuum pumping pipeline; 23—vacuum high-pressure bi-directional valve; 24—vacuum measuring gauge tube; 25—vacuum pumping machine set; 26—direct-current power supply; 27—direct-current cable; 28—vacuum sealing ring; 29—supercooled-metal-or-alloy-liquid bottom nozzle; 30—molten-steel teeming funnel; 31—molten-steel bottom-injection docking port; 32—thermal-insulation pad; 33—overcooling-treatment crucible; 34—magnesium-oxide refractory filler sand; 35—heating coil winding; 36—carbon-fiber thermal-insulation layer; 37—first cooling pipeline; 38—first thermal shields; 39—first thermal-shield cover plates; 40—carbon-fiber thermal-insulation-layer cover plate; 41—first superconducting coil; 42—housing; 43—pressurizing furnace chamber wall; 44—cushioning rubber ring; 45—reverse-directional static-magnetic-field bracket; 46—supporting cylinder; 47—second cooling pipeline; 48—temperature measuring thermocouple; 49—metal or alloy liquid; 50—lifting barb; 51—second thermal-shield cover plates; 52—vacuum furnace chamber wall; 53—second superconducting coil; 54—casting-shell mold sprue gate; 55—second thermal shields; 56—magnetism-receptor thermal-insulation shield; and 57—graphite loading plate.

DETAILED DESCRIPTION

The preferable embodiments of the present disclosure will be particularly described below with reference to the drawings. The drawings form a portion of the present disclosure, and are for explaining the principle of the present disclosure together with the embodiments of the present disclosure.

Embodiment 1

Figure 1:
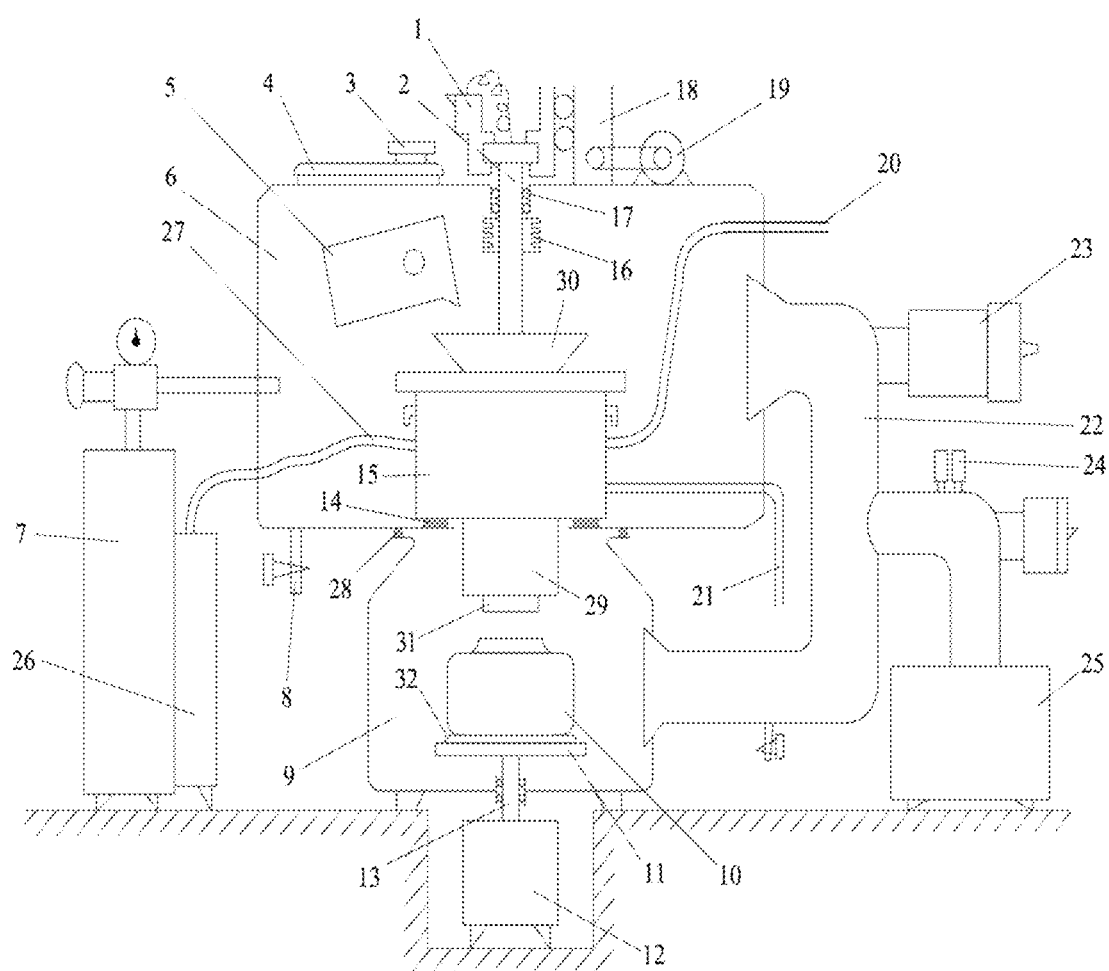
FIG. 1 is a schematic structural diagram of the three-function foundry furnace for fine crystal, non-crystal, single crystal or directional solidification provided by the present disclosure.
Figure 2:
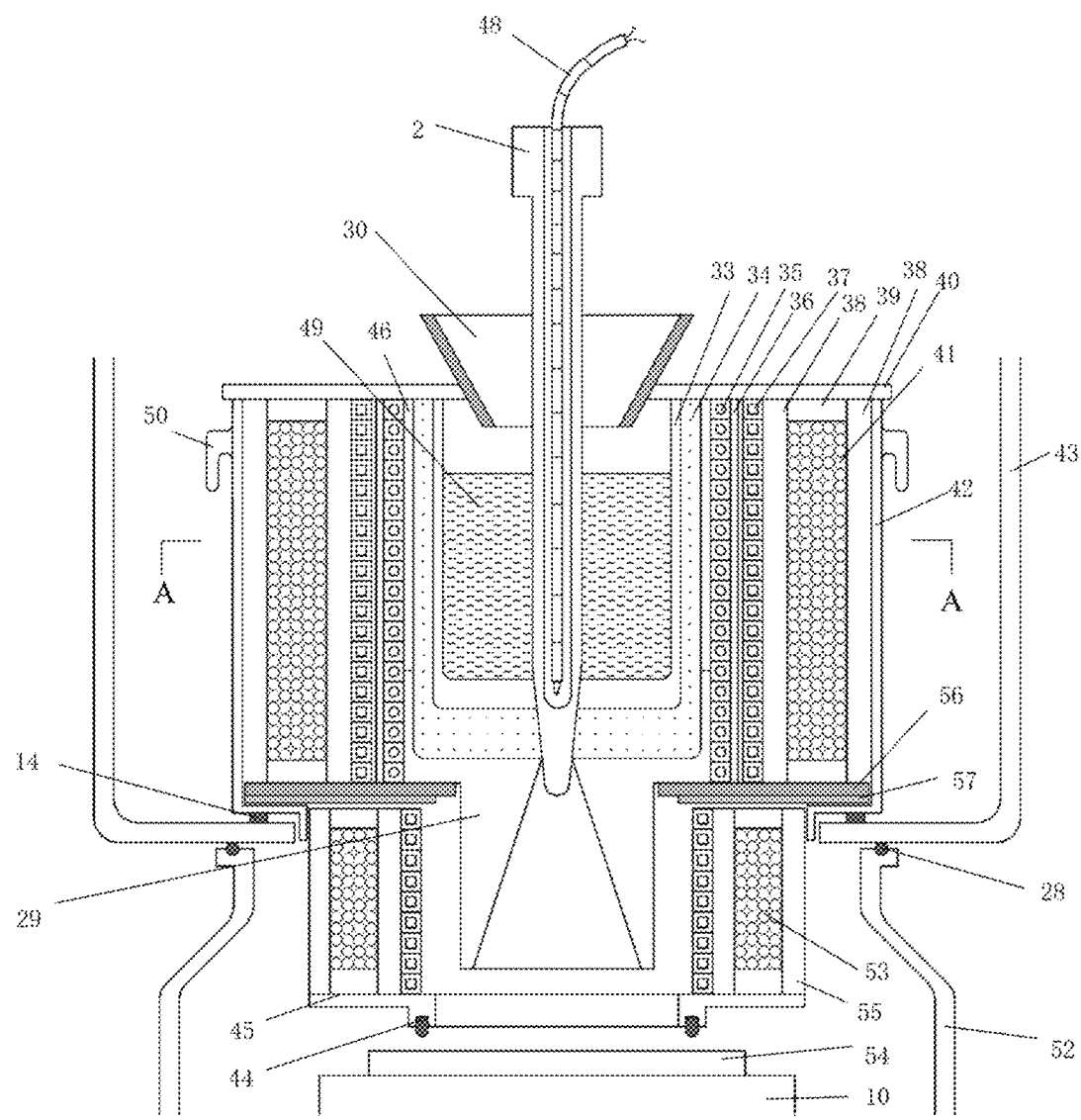
FIG. 2 is a schematic diagram of the internal structure of the casting-shell mold chamber of the foundry furnace for fine crystal provided by embodiment 1.
Figure 3:
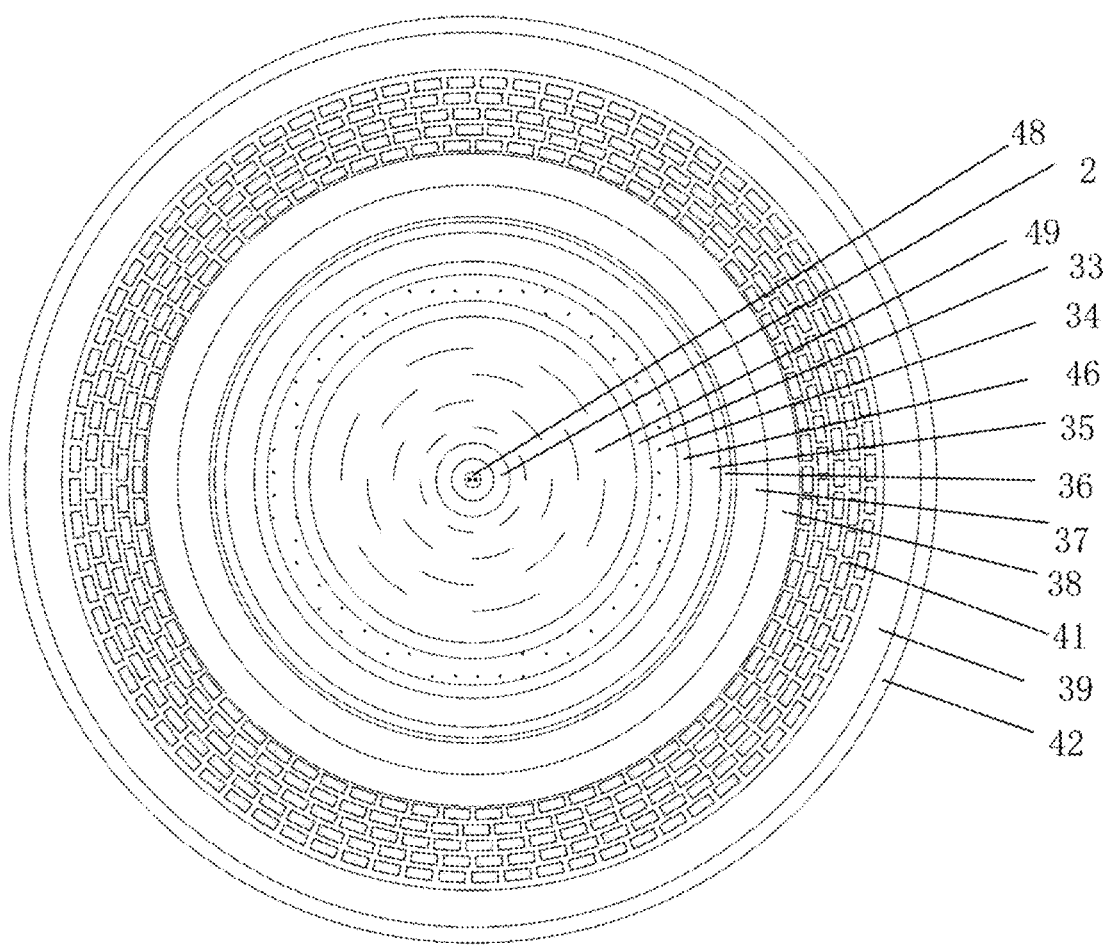
FIG. 3 is a schematic top view of the AA section of the three-function foundry furnace for fine crystal, non-crystal, single crystal or directional solidification provided by the present disclosure.
Figure 4:
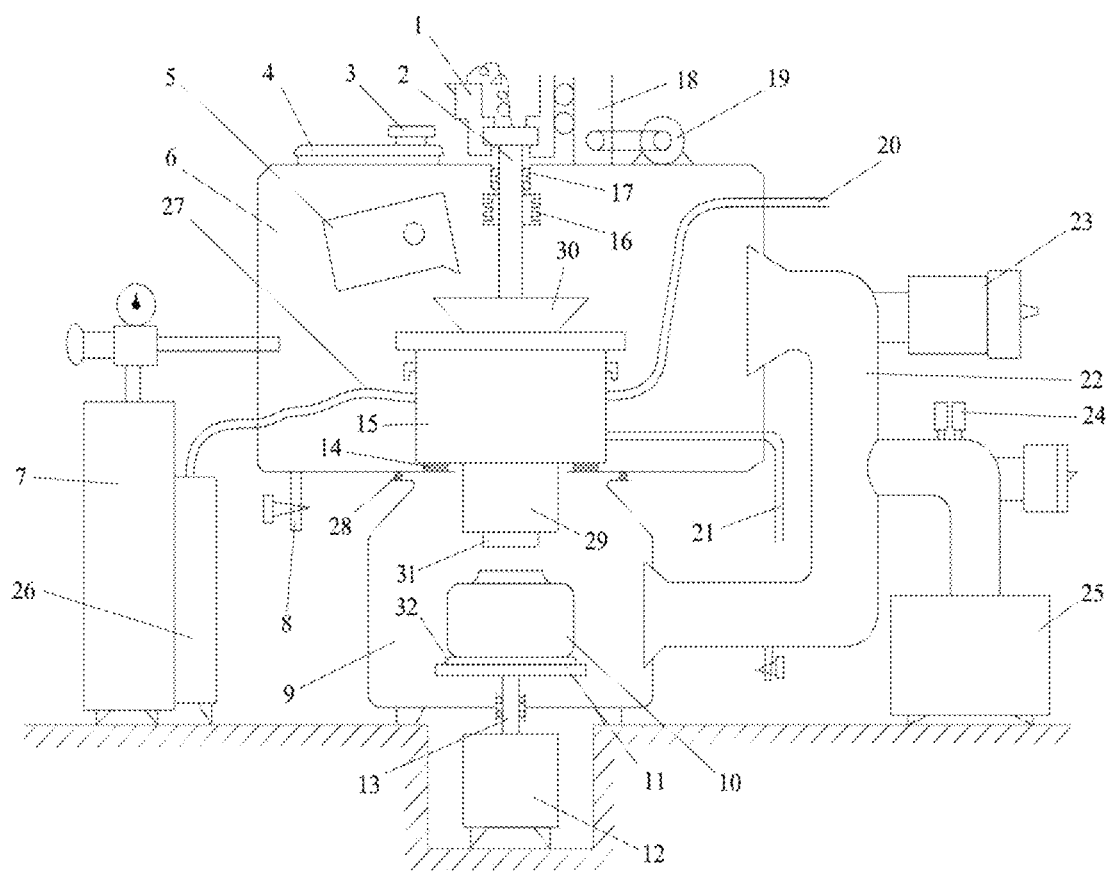
FIG. 4 is a schematic structural diagram of the foundry furnace for fine crystal and non-crystal provided by embodiment 2.

This embodiment provides a casting-shell mold chamber. As shown in FIGS. 1-3, the casting-shell mold chamber is divided into a forward-directional static-magnetic-field heating zone and a reverse-directional static-magnetic-field zone located under the forward-directional static-magnetic-field heating zone, and includes a heating coil winding 35 (for example, a tungsten-alloy heating coil winding sleeved by a high-purity aluminum-oxide corundum cannula), a first thermal-shield assembly, a first superconducting coil 41, a second thermal-shield assembly and a second superconducting coil 53. The first thermal-shield assembly is sleeved at outside of the heating coil winding, the first superconducting coil 41 is provided at inside of the first thermal-shield assembly, and the first thermal-shield assembly encloses the first superconducting coil 41; and the second superconducting coil 53 is provided at inside of the second thermal-shield assembly, the second thermal-shield assembly encloses the second superconducting coil 53, the second thermal-shield assembly is located under the first thermal-shield assembly, the directions of the magnetic field of the first superconducting coil 41 and the magnetic field of the second superconducting coil 53 are opposite, the heating coil winding 35 form a forward-directional static-magnetic-field heating zone, and the second superconducting coil 53 forms a reverse-directional static-magnetic-field zone.

The design principle of the casting-shell mold chamber provided by this embodiment is as follows:

Currently, it has been proven in both mathematics and observation that the essence in physics of the gravitational field is space-time curving. Among the four interaction forces of the nature, the acting force of the universal gravitation is weaker, and the acting force of the static-magnetic-field force is more intense. Furthermore, because the acting intensity of the electromagnetic force is larger than that of the universal gravitation by several ten powers of ten, the degree of the space-time curving of the electromagnetic force field is far larger than the degree of the space-time curving of the gravitational field. That is, because of the application of the static magnetic field, the space-time intervals of the electric parts and the neutral parts of the atoms have asynchronous curving.

Specifically, all of metals or alloys are formed by atoms, an atom includes the electric part and the neutral part, the electric part is the negative electrons and the positive electrons, the positive electrons and the neutrons form the protons, the protons form the nucleus, and the negative electrons run externally to the nucleus. Regardless of a magnetic substance or a non-magnetic substance, the space-time intervals where the positive electrons and the negative electrons in its atoms are located, in such an intense-acting-force gravitational field as electrostatic electromagnetic field, definitely have the corresponding curving, while the curving degrees of the space-time intervals where the neutral parts of the atoms are located still maintain the curving degree of the space-time intervals of such a weak-acting-force gravitational field as the universal gravitation where they are located, which is, as described above, that the curving degrees of the space-time intervals of the electric parts and the neutral parts of the atoms are nonsynchronous. Accordingly, the space-time intervals of the electric parts of the atoms of the substance are reduced. It should be noted that, the neutral parts of the atoms of the substance account for 99.9% of the mass of the nucleuses, and the mass of the positive electrons and the mass of the negative electrons are the same, so the ones of the smaller mass, even in the intense-acting-force gravitational field as electrostatic electromagnetic field, cannot obviously change the space-time positions of the nucleuses determined by the degree of the space-time curving in the weak-acting-force gravitational field. Therefore, the distances between the nucleuses of the substance do not change. The distances between them are determined merely by the magnitude of their average translation kinetic energy, that is, determined by the temperature. Moreover, the solidification of liquids is in fact that the electron clouds of the negative electrons of neighboring atoms contact, to have electron exchange, bond formation and crystallization. Therefore, if the distances between neighboring nucleuses do not change, but the electron clouds shrink, they cannot contact to form bonds and crystallize. Therefore, under the electromagnetic-force space-time-curving condition generated by the static magnetic field, the substance, even if the liquid temperature is below the solidifying point, still does not solidify or crystallize, thereby generating liquid supercooling.

As compared with the prior art, the casting-shell mold chamber provided by this embodiment uses a superconducting material to manufacture the first superconducting coil 41 and the second superconducting coil 53. A relatively large magnetic field is formed within the first superconducting coil 41, the weaker gravitational field and the more intense static magnetic field are mutually superimposed, which can generate asynchronous curving, whereby when the liquid state of the metal or alloy within the first superconducting coil 41 cools to below its normal-state solidifying point, it does not solidify, the atoms between the metal or alloy liquid 49 cannot form bonds and crystallize, whereby the alloy generates a liquid-deep-supercooling capacity which has a high external-interference tolerance, a high spatial-transference stability and a high time-length stability.

It should be noted that, the service temperature of superconducting materials is low. This embodiment, by providing the first superconducting coil 41 in the first thermal-shield assembly, and providing the second superconducting coil 53 in the second thermal-shield assembly, can better isolate the high temperature generated by the heating coil winding 35, thereby ensuring the normal use of the superconducting material.

When the casting-shell mold chamber is used for casting fine crystal, the metal or alloy liquid 49, under a thermodynamic driving force of the deep supercooling, and being far larger than that of normal-state solidification, nucleates and crystallizes uniformly and explosively with a large amount at various points within the casting-shell mold, to form a super-fine-crystal structure. At the industrial magnitude level and the industrial roughness level, the entire casting cross-section is nearly full of uniform and fine isometric-crystal grains, the fineness degree of the grains can even exceed that of the forging grade, and the grains do not have the texture and the storage energy of forged and rolled structures, and are isotropic and thermodynamic equilibrium-stable fine isometric crystals. Especially, the duration of the deep supercooling of the liquid in the mold cavity is prolonged, whereby the cavity filling capacity reaches the cavity filling capacity of the pure liquid, and, because the pure liquid can maintain for a period of time after the cavity filling has completed, that provides the time required for escape of gas and inclusions and solidification feeding, to enable its compactness to be equal to those of forging and rolling.

When the casting-shell mold chamber is used for casting a single crystal, because of the intense static magnetic field generated by the first superconducting coil 41, the metal or alloy liquid 49 has a supercooling melting point below the normal-state melting point, and on the basis of the temperature width of the common temperature gradient, the temperature width from the normal-state melting point to the supercooling melting point is superimposed, which is equivalent to improving the temperature gradient in the casting process of single crystal, which can reach the level of planar solidification, nearly without dendritic crystal. Furthermore, that can reach the industrial magnitude level and the industrial roughness tolerance level, to enable it to be used to draw directional solidified eutectic authigenic fiber composite products, the service performance of which is far better than that of the conventional single-crystal products. Moreover, the providing of the second thermal-shield assembly reduces the temperature within the second superconducting coil 53, which can further improve the temperature gradient in the casting process of single crystal.

When the casting-shell mold chamber is used for casting non-crystal, the non-crystal-metal-or-alloy products that are obtained by solidification by using the technique of asynchronous-curving supercooling, because of the balanced solidification after all of the average translation kinetic energy of the supercooled liquid is dissipated of the supercooled liquid, compared with the non-crystal-metal-or-alloy products that are manufactured by quenching methods such as single-roller method, double-roller method and so on, which are currently used for industrial production, tend to the thermodynamic equilibrium state to a further extent, and have a smaller storage energy. Therefore, the non-crystal-metal-or-alloy products have crystallization reaction in use, which makes its trend of reduced performance be smaller, and obviously are more compact than the products obtained by the deposition methods.

Certainly, for the demand of conventional casting, the foundry furnace in the mode of fine-crystal casting, by not inputting the high-power direct current into the coil to generate the intense static magnetic field in the solidification region, may also be used as a conventional foundry furnace.

Considering that superconducting materials are sensitive to temperature, in order to further reduce the influence of the tungsten-alloy heating coil winding 35, which is mainly for heating, on the first superconducting coil 41, a thermal-insulation layer (for example, a carbon-fiber thermal-insulation layer 36) and a first cooling pipeline 37 (for example, a square copper tube for circulatingly and compulsorily cooling liquid) which are sleeved at outside of the tungsten-alloy heating coil winding 35 may be successively provided between the tungsten-alloy heating coil winding 35 and the first thermal-shield assembly, and the square copper tube is provided with a circulated-forced-cooling-liquid outputting pipeline 20 and a circulated-forced-cooling-liquid inputting pipeline 21. The thermal-insulation layer can better absorb the heat generated by the tungsten-alloy heating coil winding 35, whereby the heat generated by the tungsten-alloy heating coil winding 35 substantially does not emit to the first thermal-shield assembly. The first cooling pipeline 37 can further reduce the temperature of the environment where the first thermal-shield assembly is located, and thus can substantially prevent the influence of the tungsten-alloy heating coil winding 35 on the first superconducting coil 41, to meet the requirement on the superconducting temperature of the first superconducting coil 41, to enable it to generate a static magnetic field of a sufficient intensity, to enable the metal or alloy liquid 49 to be in the deep-supercooling state.

In order to reduce the temperature of the second superconducting coil 53, which forms the reverse-directional static magnetic field, a second cooling pipeline 47 is provided at the inside of the second thermal-shield assembly, wherein the second cooling pipeline 47 is also a square copper tube for circulatingly and compulsorily cooling liquid. The second cooling pipeline 47 can ensure the low-temperature environment that the second superconducting coil 53 requires, and then ensure that a zero-magnetism plane is formed between the reverse-directional static magnetic field and the forward-directional static magnetic field and at the magnetism-receptor thermal-insulation shield 56, to intercept the supercooling function of the asynchronous space-time curving that is caused by the downward static magnetic field, to form a large temperature gradient. In addition, the cooling function of the second thermal-shield assembly also facilitates to form a large temperature gradient.

Regarding the structures of the first thermal-shield assembly and the second thermal-shield assembly, specifically, the first thermal-shield assembly includes first thermal shields 38 located at the two sides of the first superconducting coil 41 and first thermal-shield cover plates 39 located at the top and the bottom of the first superconducting coil 41, and the first thermal shields 38 and the first thermal-shield cover plates 39 form a space for containing the first superconducting coil 41. Similarly, the second thermal-shield assembly includes second thermal shields 55 located at the two sides of the second superconducting coil 53 and second thermal-shield cover plates 51 located at the top and the bottom of the second superconducting coil 53, and the second thermal shields 55 and the second thermal-shield cover plates 51 form a space for containing the second superconducting coil 53.

In order to further reduce the heating and the emission of heat and magnetic lines of force of the forward-directional static-magnetic-field application zone, and increase the temperature gradient, a carbon-fiber thermal-insulation-layer cover plate 40 and a magnetism-receptor thermal-insulation shield 56 may be provided respectively over and under the first thermal-shield assembly. The carbon-fiber thermal-insulation-layer cover plate 40 can reduce the dissipation of the heat within the shell mold chamber, and the magnetism-receptor thermal-insulation shield 56 provided at the bottom of the first thermal-shield assembly can well isolate the first thermal-shield assembly and the external environment, so that the cooling capacity generated by the first thermal-shield assembly is not emitted into the external environment, which can further reduce the cooling capacity loss of the first thermal-shield assembly, to ensure that the first superconducting coil 41 can operate at a sufficiently low temperature, thereby generating a sufficiently intense static magnetic field. Moreover, the magnetism-receptor thermal-insulation shield 56 located under the first thermal-shield assembly can also reduce and absorb the thermal radiation and magnetic lines of force within the forward-directional static-magnetic-field application zone. It should be noted that, the magnetism-receptor thermal-insulation shield 56 is required to extend at least to the tungsten-alloy heating coil winding 35, so the magnetism-receptor thermal-insulation shield 56 cannot only have the function of isolating the cooling capacity of the first thermal-shield assembly and the heat of the tungsten-alloy heating coil winding 35, but can also have the function of supporting the heating coil winding 35, the thermal-insulation layer, the first cooling pipeline 37 and the first thermal-shield assembly.

In order to reduce the interference between the magnetic lines of force generated by the first superconducting coil 41 and the magnetic lines of force generated by the second superconducting coil 53, a graphite loading plate 57 may be provided between the first thermal-shield assembly and the second thermal-shield assembly. The graphite loading plate 57 cannot only resist high temperature, to ensure the stability of the entire structure of the casting-shell mold chamber, but can also absorb the magnetic lines of force generated by the first superconducting coil 41 and the second superconducting coil 53, thereby reducing the interference between the magnetic lines of force generated by the first superconducting coil 41 and the magnetic lines of force generated by the second superconducting coil 53.

In order to improve the stability of the entire structure of the casting-shell mold chamber, a housing 42 may sleeved at the outside of the first thermal-shield assembly, and the housing 42 encloses the heating coil winding 35, the thermal-insulation layer, the first cooling pipeline 37 and the first thermal-shield assembly, so that the components can form an integration, to improve the stability of the entire structure of the casting-shell mold chamber. Moreover, the housing can also protect the first thermal-shield assembly from collision, thereby ensuring the normal use of the first thermal-shield assembly.

It can be understood that, in order to facilitate the assembling and maintenance of the casting-shell mold chamber, it may also include a lifting barb 50 provided at the outside of the housing, and the assembling, replacing and maintenance of the casting-shell mold chamber can be more conveniently performed by using the lifting barb 50.

Embodiment 2

This embodiment provides a foundry furnace for fine crystal and non-crystal. As shown in FIGS. 1-4, it includes a pressurizing furnace chamber 6, a vacuum furnace chamber 9, the casting-shell mold chamber provided by embodiment 1, a lifting-vertical-column combined crystallizer 13, a casting-shell mold 10 and a casting-shell mold lifting tray 11; the lifting-vertical-column combined crystallizer 13, the casting-shell mold 10 and the casting-shell mold lifting tray 11 are located within a reverse-directional static-magnetic-field application zone, the casting-shell mold 10 is provided on the casting-shell mold lifting tray 11, and the casting-shell mold lifting tray 11 is provided on the lifting-vertical-column combined crystallizer 13; the heating coil winding 35, the first thermal-shield assembly and the first superconducting coil 41 are located within the pressurizing furnace chamber 6; and the second thermal-shield assembly and the second superconducting coil 53 are located within the vacuum furnace chamber 9.

Specifically, a supporting cylinder 46 is provided at the inside of the heating coil winding 35 of this embodiment (for example, an aluminum-oxide refractory-material supporting cylinder). An overcooling-treatment crucible 33 is provided within the supporting cylinder, for example, a magnesium-oxide refractory-material overcooling-treatment crucible. The magnesium-oxide refractory-material overcooling-treatment crucible is filled with a magnesium-oxide refractory filler sand 34. A molten-steel teeming funnel 30 is provided over the overcooling-treatment crucible 33. A thermocouple temperature-measuring-rod combined plunger bar 2 penetrates the molten-steel teeming funnel 30 and the overcooling-treatment crucible 33, and its bottom penetrates the supporting cylinder 46 and extends to a supercooled-metal-or-alloy-liquid bottom nozzle 29. A temperature measuring thermocouple 48 is provided within the thermocouple temperature-measuring-rod combined plunger bar 2, and a thermocouple temperature measuring display 1 is provided at the top of the temperature measuring thermocouple 48, for displaying the temperature of metal or alloy liquid 49. The bottom of the supercooled-metal-or-alloy-liquid bottom nozzle 29 corresponds to a molten-steel bottom-injection docking port 31, and the molten-steel bottom-injection docking port is for docking a casting-shell mold sprue gate 54. The casting-shell mold sprue gate 54 is provided at the top surface of the casting-shell mold 10. The casting-shell mold 10 is provided on a thermal-insulation pad 32. The thermal-insulation pad 32 is provided on the casting-shell mold lifting tray 11. The bottom of the casting-shell mold lifting tray 11 is connected to the lifting-vertical-column combined crystallizer 13. The lifting-vertical-column combined crystallizer 13 is connected to a second lifting mechanism 12 (that is, a lifter for the casting-shell mold 10).

In order to inject the metal or alloy liquid 49 into the casting-shell mold 10, a first lifting mechanism 18 for lifting the thermocouple temperature-measuring-rod combined plunger bar 2 is provided at the top of the pressurizing furnace chamber 6, the first lifting mechanism 18 is connected to a hauling electric motor 19, and the hauling electric motor 19 drives the first lifting mechanism 18 to move, thereby driving to lift the thermocouple temperature-measuring-rod combined plunger bar 2 to move upwardly. It should be noted that, a vacuum high-pressure sealing ring 17 and a heat-resistant-steel bellows are respectively provided at the locations where the thermocouple temperature-measuring-rod combined plunger bar 2 and the wall of the pressurizing furnace chamber 6 contact, wherein the vacuum high-pressure sealing ring 17 is for ensuring the leakproofness of the pressurizing furnace chamber 6.

In order to improve the leakproofness of the pressurizing furnace chamber 6 and the vacuum furnace chamber 9, a high-pressure sealing ring 14 is provided at the contact interface between the pressurizing furnace chamber 6 and the vacuum furnace chamber 9, to prevent the gas within the pressurizing furnace chamber 6 into the vacuum furnace chamber 9, to ensure the pressurized environment of the pressurizing furnace chamber 6 and the vacuum state of the vacuum furnace chamber 9. The vacuum sealing ring 28 avoids environmental atmosphere into the vacuum furnace chamber 9.

In order to observe the foundry state within the pressurizing furnace chamber 6, a peephole 3 is provided at the top of the foundry furnace, and a furnace cover 4 of the foundry furnace is provided at the side of the peephole 3. In addition, an air evacuation valve 8 is provided at the bottom of the pressurizing furnace chamber 6, and when the pressurizing furnace chamber 6 is required to release pressure, the air evacuation valve 8 may be opened.

In order to facilitate the replacing of the overcooling-treatment crucible 33, the casting-shell mold chamber may also include a refractory-filler-sand layer (for example, a magnesium-oxide refractory filler sand) for fixing the overcooling-treatment crucible 33, and the refractory-filler-sand layer is set up at the inner wall of the heating coil winding 35 by a supporting cylinder (for example, the aluminum-oxide refractory-material supporting cylinder 46). During the practical application process, the overcooling-treatment crucible 33 is a consumable, and when the overcooling-treatment crucible 33 is required to be replaced, the overcooling-treatment crucible 33 that has been already broken may be taken out from the refractory filler sand, and then the new overcooling-treatment crucible 33 may be placed into the refractory filler sand. Moreover, because the particles of the refractory-filler-sand layer have gaps therebetween, once the overcooling-treatment crucible 33 has cracks to cause the metal or alloy liquid 49 to flow out, the flowing-out liquid can permeate into the gaps between the particles of the refractory-filler-sand layer, and does not further damage the supporting cylinder or the heating coil winding 35.

In order to enable the pressurizing furnace chamber 6 and the vacuum furnace chamber 9 of the above-mentioned foundry furnace for fine crystal or non-crystal to be in the vacuum state, the foundry furnace of the present disclosure further includes a vacuumizing device. The vacuumizing device includes a vacuum pumping pipeline 22, a vacuum high-pressure bi-directional valve 23, a vacuum measuring gauge tube 24 and a vacuum pumping machine set 25. The vacuum pumping pipeline 22 is connected with the pressurizing furnace chamber wall 43 and the vacuum furnace chamber wall 52 of the foundry furnace. When the pressurizing furnace chamber 6 and the vacuum furnace chamber 9 require vacuum treatment, the vacuum pumping machine set 25 is started up, and the vacuum pumping machine set 25 evacuates the pressurizing furnace chamber 6 and the vacuum furnace chamber 9 by the vacuum pumping pipeline 22, and after both of the pressurizing furnace chamber 6 and the vacuum furnace chamber 9 are in the vacuum state, the vacuum high-pressure bi-directional valve 23 is closed, and inside of the vacuum furnace chamber 9 maintains a certain vacuum degree by using the vacuum measuring gauge tube 24.

In order to better fix the vacuum furnace chamber 9, a reverse-directional static-magnetic-field bracket 45 is provided at the bottom of the vacuum furnace chamber 9, and a cushioning rubber ring 44 is provided at the bottom of the reverse-directional static-magnetic-field bracket 45. The cushioning rubber ring is for ensuring the direct elastic contact between the supercooled-metal-or-alloy-liquid bottom nozzle 29 and the casting-shell mold sprue gate 54.

In order to cause the pressurizing furnace chamber 6 to be in the pressurized state, the foundry furnace of the present disclosure further includes an inert-gas pressurizing device 7, and the inert-gas pressurizing device 7 is connected with the inside of the pressurizing furnace chamber 6 by a pipeline. A direct-current power supply 26 used by the superconducting coils is connected to the overcooling-treatment device 15 by a direct-current cable 27, and the overcooling-treatment crucible 33 (for example, the magnesium-oxide refractory-material overcooling-treatment crucible) is provided within the overcooling-treatment device 15.

As compared with the prior art, the foundry furnace provided by this embodiment is divided into the pressurizing furnace chamber 6 and the vacuum furnace chamber 9, and there is a pressure differential between the pressurizing furnace chamber 6 and the vacuum furnace chamber 9. When the metal or alloy liquid 49 enters the casting-shell mold 10 via a steel-tapping hole at the bottom of the overcooling-treatment crucible 33 and the casting-shell mold sprue gate at the top of the casting-shell mold 10, the metal or alloy liquid 49 can be quickly injected into the casting-shell mold 10 under the effect of the pressure differential, thereby realizing quick foundry.

It should be noted that, the dividing the furnace chamber of the foundry furnace into the pressurizing furnace chamber 6 and the vacuum furnace chamber 9 is in order to adapt for the improvement of the casting-shell mold chamber. Specifically, because the metal or alloy liquid 49 is in the overcooling-treatment crucible 33, under the effect of the intense magnetic field generated by the first superconducting coil 41, the metal or alloy liquid 49 has deep supercooling, the supercooling degree of which is far greater than that of conventional coils made from non-superconducting materials. During the teeming process, once the metal or alloy liquid 49 leaves the effect of the intense magnetic field generated by the first superconducting coil 41, it has quick solidification, and if the flowing speed of the metal or alloy liquid 49 is too slow, it easily solidifies at the steel-tapping hole, between the steel-tapping hole and the casting-shell mold sprue gate at the top of the casting-shell mold 10 or at the casting-shell mold sprue gate, so the desired product cannot be obtained. Therefore, the furnace chamber of the above-mentioned foundry furnace is divided into the pressurizing furnace chamber 6 and the vacuum furnace chamber 9, and when the metal or alloy liquid 49 enters the casting-shell mold 10 via a steel-tapping hole at the bottom of the overcooling-treatment crucible 33 and the casting-shell mold sprue gate at the top of the casting-shell mold 10, the metal or alloy liquid 49 can be quickly injected into the casting-shell mold 10 under the effect of the pressure differential, thereby preventing that during the teeming process, the metal or alloy liquid 49 solidifies at the steel-tapping hole, between the steel-tapping hole and the casting-shell mold sprue gate or at the casting-shell mold sprue gate.

FIGS. 1 and 2 are the basic mode of the foundry furnace for the three functions of fine crystal and non-crystal and single crystal, and the mode can be adapted for general foundry of metal fine crystal and non-crystal.

Embodiment 3

Figure 5:
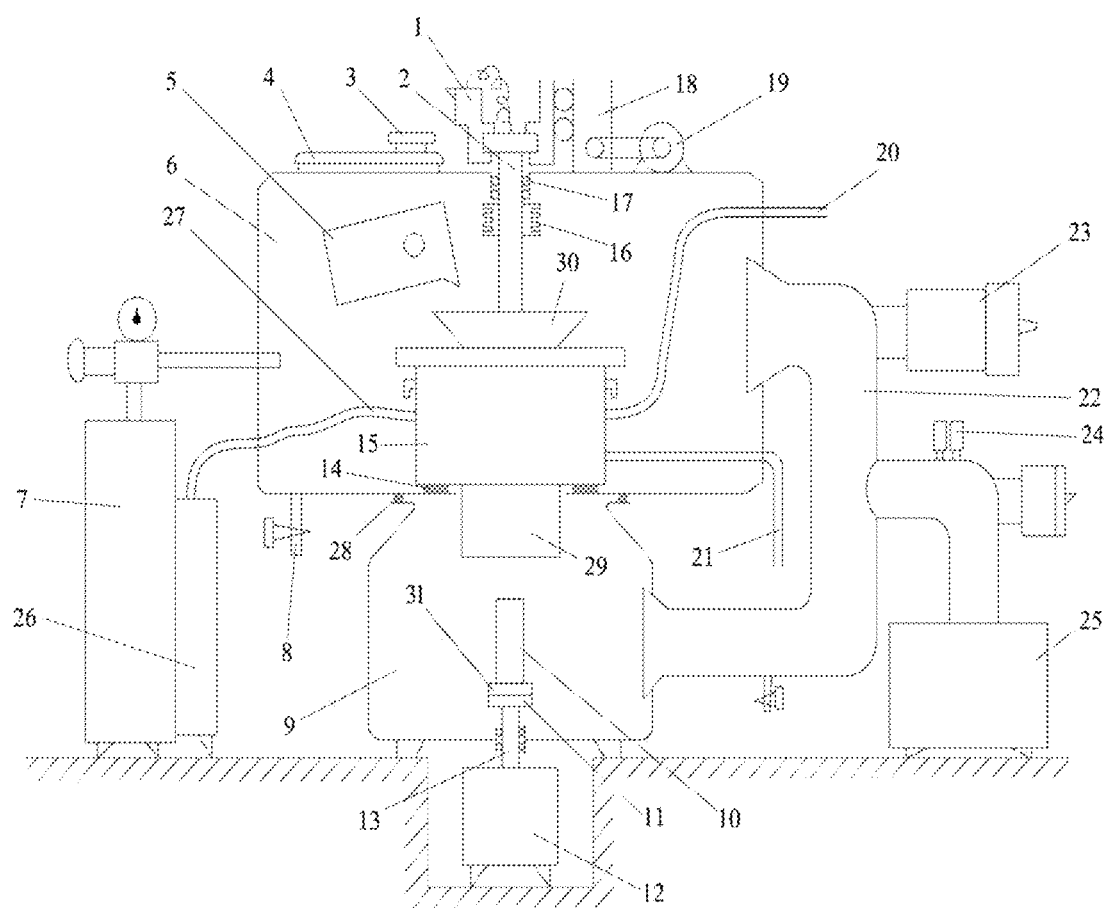
FIG. 5 is a schematic structural diagram of the foundry furnace for fine crystal or non-crystal provided by embodiment 3.
Figure 6:
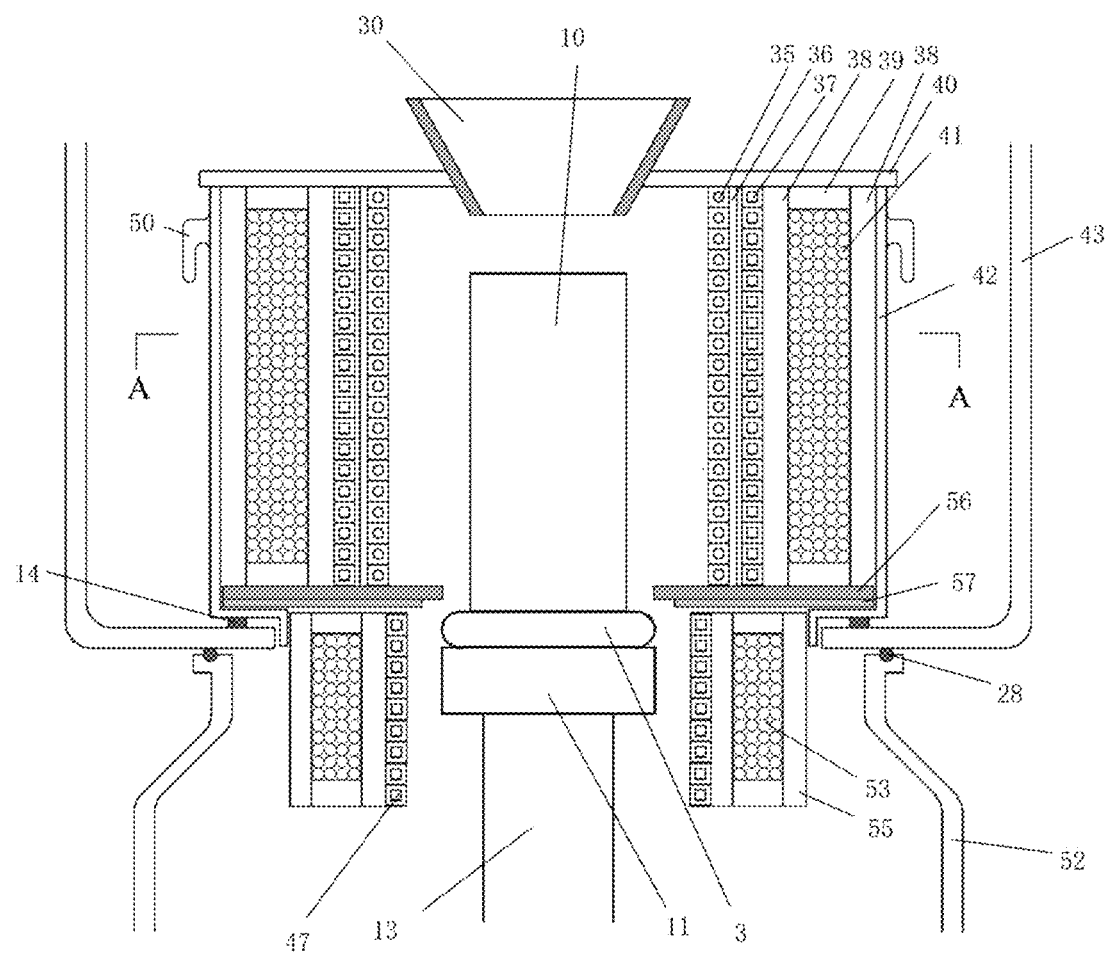
FIG. 6 is a schematic diagram of the internal structure of the foundry furnace for fine crystal and non-crystal provided by embodiment 3.

This embodiment provides a foundry furnace for fine crystal and non-crystal. As shown in FIGS. 5 and 6, the basic structure and operating mode of the foundry furnace for fine crystal and non-crystal are the same as those of the foundry furnace of embodiment 2, and the difference is that, the temperature measuring thermocouple 48, the thermocouple temperature-measuring-rod combined plunger bar 2, the overcooling-treatment crucible 33 and the metal or alloy liquid 49 within it, the magnesium-oxide filler sand, the supporting cylinder 51, the supercooled-metal-or-alloy-liquid bottom nozzle 29, the casting-shell mold sprue gate 54, the cushioning rubber ring 44 and the reverse-directional static-magnetic-field bracket 45 of the foundry furnace for fine crystal and non-crystal provided by embodiment 2 with are removed, and they are adjusted to be the structure of FIGS. 5 and 6. That is, the casting-shell mold lifting tray 11 is provided on the lifting-vertical-column combined crystallizer 13, the thermal-insulation pad 32 is placed on the casting-shell mold lifting tray 11, the casting-shell mold 10 is provided on the thermal-insulation pad 32, and the casting-shell mold 10 is lift into the pressurizing furnace chamber 6 by using the lifting-vertical-column combined crystallizer 13, and teems the metal or alloy liquid 49 into the casting-shell mold 10 via the molten-steel teeming funnel 30.

Embodiment 4

Figure 7:
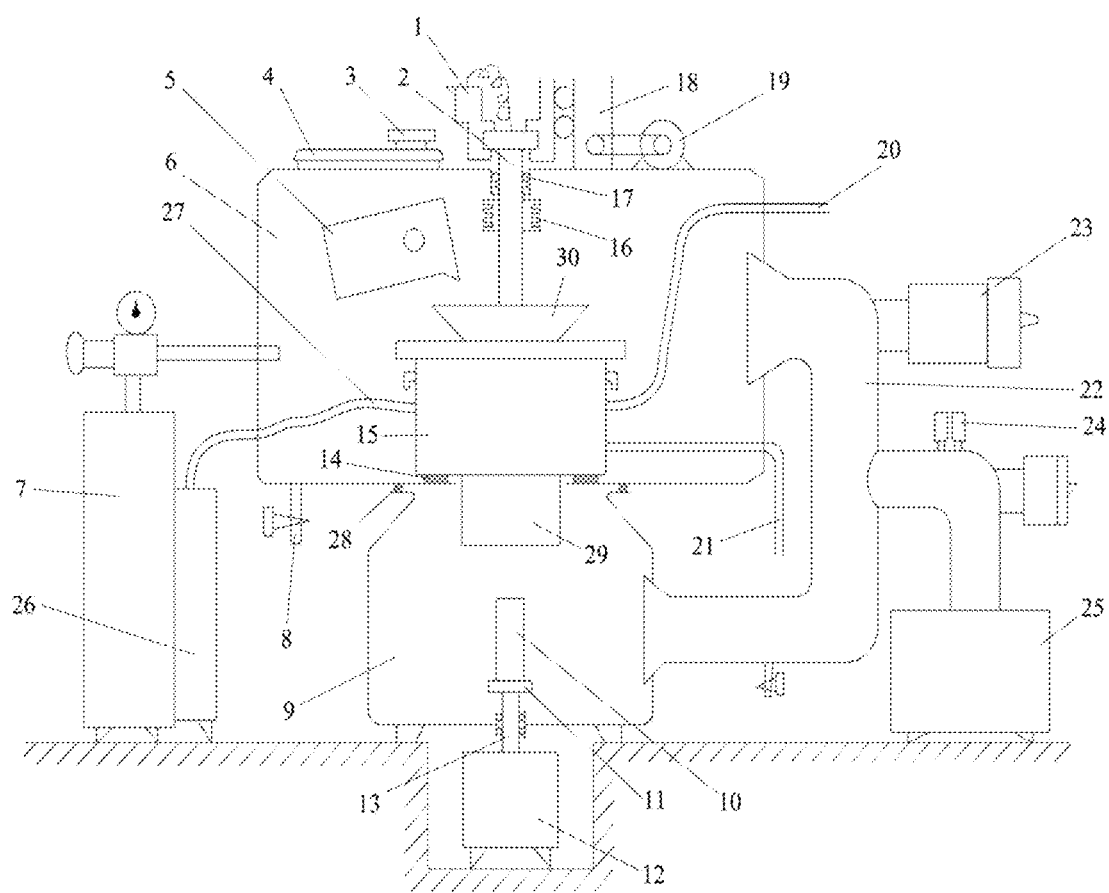
FIG. 7 is a schematic structural diagram of the foundry furnace for single crystal or directional solidification provided by embodiment 4.
Figure 8:
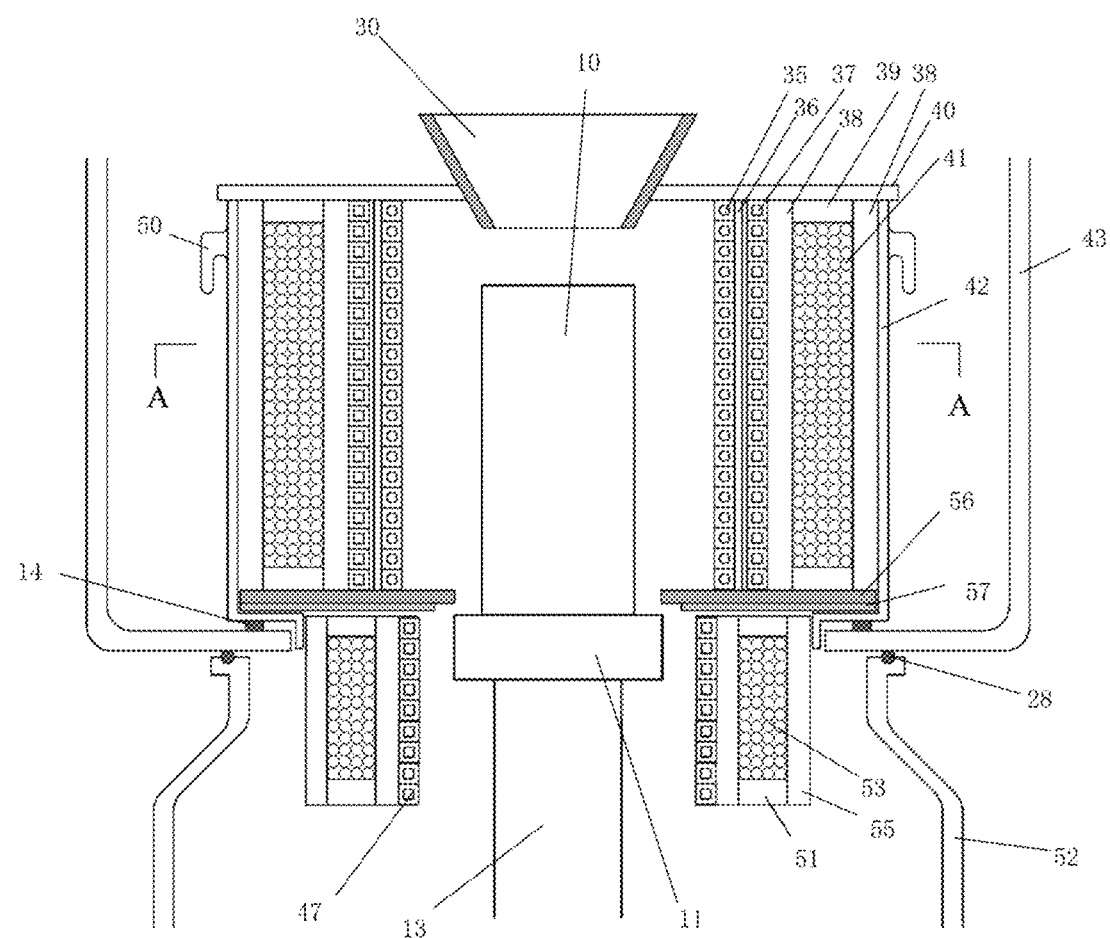
FIG. 8 is a schematic diagram of the internal structure of the foundry furnace for single crystal or directional solidification provided by embodiment 4.

This embodiment provides a foundry furnace for single crystal or directional solidification. The basic structure and operating mode of the foundry furnace for single crystal or directional solidification are the same as those of embodiment 3, and the difference is that, the top of the lifting-vertical-column combined crystallizer directly contact with the casting-shell mold 10, and the thermal-insulation pad 32 between them must be removed, to facilitate the lifting-vertical-column combined crystallizer to play a role of oriented heat conduction. The adjusted structure of the foundry furnace for single crystal or directional solidification is shown in FIGS. 7 and 8. That is, the casting-shell mold lifting tray 11 is provided on the lifting-vertical-column combined crystallizer 13, the casting-shell mold 10 is lift into the pressurizing furnace chamber 6 by using the lifting-vertical-column combined crystallizer 13, and teems the metal or alloy liquid 49 into the casting-shell mold 10 via the molten-steel teeming funnel 30, and the casting-shell mold 10, which has completely teemed the molten alloy, is pulled down into the vacuum chamber by again using the lifting-vertical-column combined crystallizer 13.

Embodiment 5

This embodiment provides a method for teeming fine crystal and non-crystal in an asynchronously curved intense-magnetic-field zone, which uses the fine-crystal foundry furnace of embodiment 2. The method for teeming fine crystal includes the following steps:

Step 1: placing a mother-alloy raw material into a melting crucible 5;

Step 2: closing the furnace cover 4 and a lower furnace door, starting up the first thermal-shield assembly, the first cooling pipeline 37 (for example, a square copper tube for circulatingly and compulsorily cooling liquid), the second thermal-shield assembly and the second cooling pipeline 47, starting up the vacuum pumping machine set 25 and the vacuum pumping pipeline 22, evacuating the pressurizing furnace chamber 6 and the vacuum furnace chamber 9 into a vacuum state, and maintaining a certain vacuum degree;

Step 3: closing the vacuum high-pressure bi-directional valve 23, and starting up the inert-gas pressurizing device 7, to cause the pressure within an upper furnace chamber to reach a preset pressure value; and evacuating the vacuum furnace chamber 9 to a preset vacuum degree;

Step 4: starting up the direct-current power supply 26, to input a direct current into the tungsten-alloy heating coil winding 35 sleeved by a high-purity aluminum-oxide corundum tube, wherein the tungsten-alloy heating coil winding 35 generates heat and heats the melting crucible 5 and the mother-alloy raw material within it; and simultaneously input a direct current into the first superconducting coil 41, wherein the first superconducting coil 41 generates a static magnetic field after electrification, and then cause the overcooling-treatment device 15 and the overcooling-treatment crucible 33 to be in the static magnetic field;

Step 5: melting the mother-alloy raw material within the melting crucible 5 into the molten state, and injecting into the overcooling-treatment crucible 33 within the overcooling-treatment device 15 via the molten-steel teeming funnel 30; and Step 6: adjusting the direct current intensity and the flow rate of a circulated forced-cooling-liquid medium within the cooling pipeline, to cause the intensity of the static magnetic field within the pressurizing furnace chamber 6 to further increase, and at the same time to cause the temperature within the pressurizing furnace chamber 6 to maintain continuously decreasing, till the temperature of the metal or alloy liquid within the magnesium-oxide refractory-material overcooling-treatment crucible 33 has decreased to approximately 15° C. below its melting point, lifting upwardly the thermocouple temperature-measuring-rod combined plunger bar 2 in FIG. 2, wherein at the moment the supercooled-metal-or-alloy-liquid bottom nozzle 29 is provided between the pressurizing furnace chamber 6 and the vacuum furnace chamber 9 (wherein the supercooled-metal-or-alloy-liquid bottom nozzle 29 is made from an aluminum-oxide refractory material), and the metal or alloy liquid 49, which has been cooled to 15° C. below the normal-temperature melting point, under the pressure of the inert gas, is injected downwardly at a high speed into the casting-shell mold 10 within the vacuum furnace chamber 9 via the aluminum-oxide refractory-material bottom nozzle.

It should be noted that, in Step 6, the reason for reducing the temperature of the metal or alloy liquid 49 to approximately 15° C. below the melting point is as follows: because the space-time intervals where the neutral parts of the nucleuses and the extranuclear electrons of the metal or alloy liquid 49 are located, in the intense-static-magnetic-field environment, have asynchronous curving, the bonding electrons of the metal or alloy liquid 49 cannot form bonds and crystallize at the normal-state melting point without an intense static magnetic field, and then the metal or alloy liquid 49 still maintains the liquid state at approximately 15° C. below the normal-state melting point; that is, the metal or alloy liquid 49 is supercooled. Because what is injected into the casting-shell mold 10 is the metal or alloy liquid 49 that is below the normal-state melting point and is deep supercooled, when the metal or alloy liquid 49 has left the intense-static-magnetic-field area, the asynchronous curving of the space-time intervals where the neutral parts of the nucleuses and the extranuclear electrons of the metal or alloy liquid are located (that is, the curving degrees of them are different) will return to synchronous curving (that is, the curving degrees of the neutral parts and the electric parts of the metal or alloy liquid are the same), and at the moment, the metal or alloy liquid 49, under a thermodynamic driving force of the deep supercooling, and being far larger than that of normal-state solidification, nucleates and crystallizes uniformly and explosively with a large amount at various points within the casting-shell mold 10, to form a super-fine-crystal structure. Therefore, the casting that is solidified in the casting-shell mold 10 is a uniform fine isometric-crystal grain structure.

It should be emphasized that, in the method for teeming fine crystal, because the solidification speed of the metal liquid that is deep supercooled is very quick, in the present disclosure an inert gas is continuously introduced into the pressurizing furnace chamber 6, to cause the melting crucible 5 to be in an inert-gas pressurized environment, and the casting-shell mold 10 is in the vacuum furnace chamber 9, which is maintained a certain vacuum degree. Accordingly, when the metal or alloy liquid within the melting crucible 5 is passing through the supercooled-metal-or-alloy-liquid bottom nozzle 29, the metal or alloy liquid is not only influenced by the gravity of itself, but is also influenced by the pressure of the pressurizing furnace chamber 6 and the negative-pressure adsorption generated by the vacuum within the vacuum furnace chamber 9, which and then causes the deep-supercooled metal liquid to be injected into the casting-shell mold 10 at a high speed, to prevent that the deep-supercooled metal liquid cannot complete the teeming process in the transferring process because of exploding nucleation and crystallization.

Embodiment 6

This embodiment provides a method for teeming fine crystal and non-crystal in an asynchronously curved intense-magnetic-field zone by direct solidification, which uses the fine-crystal foundry furnace of embodiment 3. The method for teeming fine crystal includes the following steps:

Step 1: placing a mother-alloy raw material into a melting crucible 5;

Step 2: closing the furnace cover 4 and a lower furnace door, starting up the first thermal-shield assembly, the first cooling pipeline 37 (for example, a square copper tube for circulatingly and compulsorily cooling liquid), the second thermal-shield assembly and the second cooling pipeline 47, starting up the vacuum pumping machine set 25 and the vacuum pumping pipeline 22, evacuating the pressurizing furnace chamber 6 and the vacuum furnace chamber 9 into a vacuum state, and maintaining a certain vacuum degree;

Step 3: closing the vacuum high-pressure bi-directional valve 23, and starting up the inert-gas pressurizing device 7, to cause the pressure within an upper furnace chamber to reach a preset pressure value; and evacuating the vacuum furnace chamber 9 to a preset vacuum degree;

Step 4: starting up the direct-current power supply 26, to input a direct current into the tungsten-alloy heating coil winding 35 nesting a high-purity aluminum-oxide corundum tube, wherein the tungsten-alloy heating coil winding 35 generates heat and heats the melting crucible 5 and the mother-alloy raw material within it; and simultaneously input a direct current into the first superconducting coil 41, wherein the first superconducting coil 41 generates a static magnetic field after electrification, and then cause the overcooling-treatment device 15 and the overcooling-treatment crucible 33 to be in the static magnetic field; and Step 5: melting the mother-alloy raw material within the melting crucible 5 into the molten state; and lifting upwardly the casting-shell mold material in the casting-shell mold lifting tray 11 into the pressurizing furnace chamber 6 by using the second lifting mechanism 12, injecting the metal or alloy liquid within the melting crucible 5 in the molten state into the overcooling-treatment crucible 33 wherein the metal or alloy liquid directly solidifies within the asynchronously curved intense-magnetic-field zone, by regulating the direct current intensity of the heating coil (for example, the tungsten-alloy heating coil winding 35 sleeved by the high-purity aluminum-oxide corundum cannula) and the flow rate of the circulated forced-cooling-liquid medium within the first cooling pipeline 37 (that is, the square copper tube), the duration of the deep supercooling of the metal or alloy liquid 49 in the mold cavity of the casting-shell mold 10 can be prolonged, which can cause the cavity filling capacity of the metal or alloy to reach the cavity filling capacity of the pure liquid, and, because it can maintain for a duration after the cavity filling has completed, and then cause the gas and inclusions in the metal or alloy liquid 49 to escape, and to complete the solidification feeding process at the solidification speed caused by the pressure of the pressure head of the riser of the foundry teeming system, and then shutting down the direct current that generates the asynchronously curved intense magnetic field, wherein a compact fine crystal is formed after the superconducting coil is shut down; or an average translation kinetic energy that the liquid state requires is lost due to heat dissipation and therefore a non-crystal is formed. That is, the metal or alloy liquid 49 completes the final solidification of the casting product under the thermodynamic driving force of the deep supercooling. The fine-crystal or non-crystal casting product that is cast by the mode has a good compactness, and the grains of the isotropic isometric crystal on the entire casting cross-section are very fine, even finer than the grains of forged and rolled textures. It should be noted that, the size of the casting product made in this embodiment is smaller than that of the casting product that is cast in embodiment 5.

In conclusion, in the method for casting fine crystal and non-crystal provided by this embodiment, the molten steel is teemed into the casting-shell mold 10 placed on the thermal-insulation pad 32, the metal or alloy liquid 49 in the casting-shell mold 10 is in the intense-static-magnetic-field environment, the electric currents of the first superconducting coil 41 and the heating coil are controlled to cause the metal or alloy liquid 49 to slowly and continuously cool down, the system stands for a short duration after the metal or alloy liquid 49 has reached the deep-supercooling condition, to wait for the metal or alloy liquid 49 sufficiently completing the process of bubble floating, cavity filling and feeding, and then the electric currents of the first superconducting coil 41 and the heating coil are shut down, to end the intense-static-magnetic-field environment. Accordingly, a uniform and compact fine isometric-crystal grain structure can be obtained, which can reach the level of compactness for forging. The method for casting fine crystal and non-crystal provided by this embodiment cannot only cast complicated product shapes that cannot be manufactured by forging, but can also cast a uniform fine isometric-crystal grain structure that does not contain forging texture structures.

Embodiment 7

This embodiment provides a method for teeming single crystal or directional solidification in an asynchronously curved intense-magnetic-field zone, which uses the foundry furnace for single crystal or directional solidification of embodiment 4. The method for teeming single crystal or directional solidification includes the following steps:

Step 1: placing a mother-alloy raw material into a melting crucible 5;

Step 2: closing the furnace cover 4 and a lower furnace door, starting up the first thermal-shield assembly, the first cooling pipeline 37 (for example, a square copper tube for circulatingly and compulsorily cooling liquid), the second thermal-shield assembly and the second cooling pipeline 47, starting up the vacuum pumping machine set 25 and the vacuum pumping pipeline 22, evacuating the pressurizing furnace chamber 6 and the vacuum furnace chamber 9 into a vacuum state, and maintaining a certain vacuum degree;

Step 3: evacuating the vacuum furnace chamber 9 to a preset vacuum degree;

Step 4: starting up the direct-current power supply 26, to input a direct current into the tungsten-alloy heating coil winding 35 nesting a high-purity aluminum-oxide corundum tube, wherein the tungsten-alloy heating coil winding 35 generates heat and heats the melting crucible 5 and the mother-alloy raw material within it; and simultaneously input a direct current into the first superconducting coil 41, wherein the first superconducting coil 41 generates a static magnetic field after electrification, and then cause the overcooling-treatment crucible 33 to be in the static magnetic field; and Step 5: melting the mother-alloy raw material within the melting crucible 5 into the molten state; and lifting upwardly the casting-shell mold 10 into the pressurizing furnace chamber 6 by using the lifting-vertical-column combined crystallizer 13, injecting the metal or alloy liquid 49 in the molten state into the casting-shell mold 10, and pulling down the casting-shell mold 10, which has been teemed the single-crystal or directional-solidification metal or alloy liquid 49, to under the magnetism-receptor thermal-insulation shield 56 (for example, a carbon-fiber magnetism-receptor thermal-insulation shield) by using a conventional Bridgman mode (the withdrawal mode for single-crystal or directional-solidification furnaces), wherein at the moment the metal or alloy liquid 49 within the casting-shell mold 10 solidifies sequentially from bottom to top into a single-crystal or directional-solidification product.

It should be noted that, regarding single-crystal furnaces or directional-solidification furnaces, especially the single-crystal furnaces or directional-solidification furnaces of the Bridgman mode, the level of the crystallization performance mainly depends on the level of the temperature gradient of the solid-liquid interface where the crystal grows. This embodiment, by employing the supercooling principle of asynchronous curving, can use the intense static magnetic field to obtain a supercooling melting point below the normal-state melting point by a certain temperature, to sequentially obtain a temperature width from the normal-state melting point to the supercooling melting point. The temperature width of the common temperature gradient is superimposed the temperature width from the normal-state melting point to the supercooling melting point, thereby causing the temperature gradient to be greater than the common temperature gradient.

It should be noted that, in FIG. 8, because the heating coil and the first superconducting coil 41 generate a leakage magnetic field of the intense static magnetic field, and the leakage magnetic field reduces the temperature gradient at the upper and lower interface of the magnetism-receptor thermal-insulation shield 56, and then reduces the sum of the temperature gradient superimposed by the temperature gradient of the temperature width from the normal-state melting point to the supercooling melting point, and because the magnetism-receptor thermal-insulation shield 56 can absorb magnetic lines of force, the magnetism-receptor thermal-insulation shield 56 should be as thick as possible. The temperature gradient refers to the temperature/interface thickness, so although the magnetism-receptor thermal-insulation shield 56 should be as thin as possible, if it is thinner, its thermal insulation effect and magnetism insulation effect are poorer, which is more adverse to the increasing of the temperature gradient.

Accordingly, the foundry furnace for single crystal or directional solidification provided by the present disclosure provides the reverse-directional static magnetic field under the magnetism-receptor thermal-insulation shield 56 to cool and demagnetize the second superconducting coil 53, and the second superconducting coil 53, after being electrified a direct current, generates a static magnetic field in a direction opposite to the static magnetic field above the magnetism-receptor thermal-insulation shield 56, to offset the leakage magnetic field that permeates downwardly the magnetism-receptor thermal-insulation shield 56. Moreover, the second superconducting coil 53 and the thermal shields are provided with the second cooling pipeline 47, which can cool the resistance heating generated by the direct current electrified into the second superconducting coil 53 and absorb the heat that downwardly radiates and permeates the magnetism-receptor thermal-insulation shield 56. Accordingly, the single-crystal or directional-solidification casting-shell mold 10 over the magnetism-receptor thermal-insulation shield 56 is magnetized and heated, and the reverse-directional static magnetic field and the second cooling pipeline 47 under the magnetism-receptor thermal-insulation shield 56 demagnetizes and dissipates heat; therefore, a larger temperature gradient is generated at the upper and lower interface of the magnetism-receptor thermal-insulation shield 56. The foundry furnace is the same as the conventional single-crystal or directional-solidification furnaces of the Bridgman mode in terms of the other structures and operating modes for providing the function of single-crystal or directional-solidification furnaces, which are not introduced in detail here.

The present disclosure, by using the principle of asynchronous curving, realizes the casting of a metal or alloy liquid in the deep-supercooling condition. The liquid supercooling in the prior art is to cause the solidification environment of the liquid to be quiet and clean, and can reduce the temperature of the liquid to merely several degrees centigrade below the solidifying point. The essence of the conventional supercooling means is to reduce the interference to liquid solidification, whereby the liquid cannot climb across homogeneous nucleation which is a thermodynamic potential-energy barrier, to realize solidification. However, the essence of the supercooling means of the present disclosure is not to reduce the interference to liquid solidification, but is to inhibit the bond formation and crystallization of the liquid atoms. That enables the industrial applicability, and also enables scientific research for demand on higher supercooling degree.

The application area of the present disclosure is the field of precise casting apparatuses, in which field there are two types of important equipment, single-crystal furnaces and fine-crystal furnaces. From the field of foundry technology, single-crystal furnaces and fine-crystal furnaces belong to two technical fields. However, the present disclosure spans the two technical fields, to enable the same one foundry furnace to have both of the functions of a single-crystal furnace and of a fine-crystal furnace, and enable the functions to precede the current industrial-scale level in both of the two technical fields. When it is used as a single-crystal furnace, because the additional temperature gradient brought by using the technique of asynchronous-curving supercooling is superimposed, it can reach the level of planar solidification of directional solidification, and the industrial magnitude level and the industrial roughness tolerance level. When it is used as a fine-crystal furnace, because of the stable deep supercooling brought by using the technique of asynchronous-curving supercooling, it can reach the industrial magnitude level and the industrial roughness level. The entire casting cross-section is full of uniform and extremely fine isometric-crystal grains, the fineness degree reaches and even exceeds that of the forging grade, and the crystal grains do not have the texture and the storage energy of forged and rolled structures, and are isotropic and stable fine isometric crystals. Especially, the duration of the deep supercooling of the liquid in the mold cavity is prolonged, whereby the cavity filling capacity reaches the cavity filling capacity of the pure liquid, and, because the pure liquid can maintain for a duration after the cavity filling has completed, that provides the duration required for gas and inclusions and solidification feeding, to enable its compactness to be equal to those of forging and rolling.

Moreover, the present disclosure does not only span the two technical fields of single-crystal furnaces and fine-crystal furnaces, but also, because of the great deep supercooling brought by using the technique of asynchronous-curving supercooling, enables the casting production of non-crystal-metal-or-alloy products of a block shape or other shapes. The present disclosure, by using the principle of asynchronous-curving supercooling, by using the non-crystal-metal or alloy foundry furnace having the particular structural design, can obtain block-shaped non-crystal-metal-or-alloy products, and can also obtain non-crystal-metal or alloy casting products having various shapes. In addition, regarding the principle of deep supercooling, the non-crystal-metal-or-alloy products that are obtained by solidification by using the technique of asynchronous-curving supercooling, because of the balanced solidification of the supercooled liquid, compared with the non-crystal-metal-or-alloy products that are manufactured by quenching methods such as single-roller method, double-roller method and so on, which are currently used for industrial production, tend to the thermodynamic equilibrium state to a further extent, and have smaller storage energy. Therefore, the non-crystal-metal-or-alloy products have crystallization reaction in use, which makes its trend of reduced non-crystal performance be smaller, and obviously are more compact than the products of the deposition methods.

The present disclosure, on the basis of comprehensively considering the requirements on the solidification of single crystal, fine crystal and non-crystal and the feasibility in industrial production, designs the three-function foundry furnace that can produce single-crystal products, fine-crystal products and non-crystal products, which does not only realize the integration of the three functions, but also enables the three functions to reach or even exceed the current industrial levels, especially the level of the casting of non-crystal metals.

The above are merely preferable particular embodiments of the present disclosure, and the protection scope of the present disclosure is not limited thereto. All of the variations or substitutions that a person skilled in the art can easily envisage within the technical scope disclosed by the present disclosure should fall within the protection scope of the present disclosure.

What is claimed is:

1. A method for casting single crystal or directional solidification, wherein the method uses a foundry furnace, and the method for casting single crystal or directional solidification comprising:

Step 1: starting up a first thermal-shield assembly, a first cooling pipeline and a second thermal-shield assembly, evacuating a pressurizing furnace chamber and a vacuum furnace chamber into a vacuum state, and maintaining a certain vacuum degree; and then melting a mother-alloy raw material in a melting crucible;

Step 2: starting up a first superconducting coil, a heating coil winding and a second superconducting coil, to form an a static-magnetic-field environment within a casting-shell mold for single-crystal or directional-solidification, the casting-shell mold is within a casting-shell mold chamber, and the casting-shell mold chamber is within the pressurizing furnace chamber, and then teeming the molten mother alloy that has been molten in the melting crucible in Step 1 into the casting-shell mold, to realize supercooling in the static-magnetic-field environment, and the supercooling means the molten mother alloy still maintains the liquid state at temperature that is below the normal-state melting point; and Step 3: pulling down the casting-shell mold of Step 2 into the vacuum furnace chamber by using a lifting-vertical-column combined crystallizer, during the pulling down process the casting-shell mold passes through from top to bottom the magnetism-receptor thermal-insulation shield and a zero-magnetism plane that is formed by a mutually-reverse-directional static magnetic fields of the second superconducting coil and the first superconducting coil, to cause the molten mother or alloy within the casting-shell mold to solidify sequentially from bottom to top into a single-crystal or directional-solidification product;

the foundry furnace comprises the pressurizing furnace chamber, the vacuum furnace chamber, the lifting-vertical-column combined crystallizer, the casting-shell mold, a casting-shell mold lifting tray and the casting-shell mold chamber, and the casting-shell mold chamber comprises the heating coil winding, the first thermal-shield assembly, the first superconducting coil, the second thermal-shield assembly and the second superconducting coil; and the first thermal-shield assembly is provided at an outside of the heating coil winding, the first superconducting coil is provided at an inside of the first thermal-shield assembly, and the second superconducting coil is provided at an inside of the second thermal-shield assembly; the second thermal-shield assembly is provided under the first thermal-shield assembly, and directions of a magnetic field generated by the first superconducting coil and a magnetic field generated by the second superconducting coil are opposite; and the first superconducting coil and the heating coil winding form a forward-directional static-magnetic-field heating zone, and the second superconducting coil forms a reverse-directional static-magnetic-field zone;

the casting-shell mold is provided on the casting-shell mold lifting tray, and the casting-shell mold lifting tray is provided on the lifting-vertical-column combined crystallizer; and the heating coil winding, the first thermal-shield assembly and the first superconducting coil are located within the pressurizing furnace chamber; and the second thermal-shield assembly and the second superconducting coil are located within the vacuum furnace chamber.

2. The method for casting single crystal or directional solidification according to claim 1, wherein in Step 1, before evacuating the pressurizing furnace chamber and the vacuum furnace chamber into the vacuum state, a second cooling pipeline is also started up.

3. The method for casting single crystal or directional solidification according to claim 1, wherein in Step 2, after starting up the first superconducting coil, the heating coil winding and the second superconducting coil, before teeming the molten mother alloy into the casting-shell mold, the method further comprises lifting upwardly the casting-shell mold into the pressurizing furnace chamber by using the lifting-vertical-column combined crystallizer.

4. The method for casting single crystal or directional solidification according to claim 1, wherein in Step 3, pulling down the casting-shell mold of Step 2 into the vacuum furnace chamber by using a lifting-vertical-column combined crystallizer by using a Bridgman mode.

* * * * *